US012460313B2

(12) United States Patent
Kellerman et al.

(10) Patent No.: US 12,460,313 B2
(45) Date of Patent: Nov. 4, 2025

(54) ACTIVE EDGE CONTROL OF A CRYSTALLINE SHEET FORMED ON THE SURFACE OF A MELT

(71) Applicant: Blue Origin Manufacturing, LLC, Huntsville, AL (US)

(72) Inventors: Peter Kellerman, Essex, MA (US); Alison Greenlee, Somerville, MA (US); Parthiv Daggolu, Danvers, MA (US); Alexander Martinez, Woburn, MA (US)

(73) Assignee: Blue Origin Manufacturing, LLC, Huntsville, AL (US)

( * ) Notice: Subject to any disclaimer, the term of this patent is extended or adjusted under 35 U.S.C. 154(b) by 102 days.

(21) Appl. No.: 17/801,198

(22) PCT Filed: Feb. 19, 2021

(86) PCT No.: PCT/US2021/018790
§ 371 (c)(1),
(2) Date: Aug. 19, 2022

(87) PCT Pub. No.: WO2021/168256
PCT Pub. Date: Aug. 26, 2021

(65) Prior Publication Data

US 2023/0096046 A1 Mar. 30, 2023

Related U.S. Application Data

(60) Provisional application No. 62/978,484, filed on Feb. 19, 2020.

(51) Int. Cl.
*C30B 15/26* (2006.01)
*C30B 15/06* (2006.01)
(Continued)

(52) U.S. Cl.
CPC .............. *C30B 15/06* (2013.01); *C30B 15/10* (2013.01); *C30B 15/26* (2013.01); *C30B 29/06* (2013.01)

(58) Field of Classification Search
CPC ......... C30B 15/00; C30B 15/06; C30B 15/10; C30B 15/14; C30B 15/20; C30B 15/22;
(Continued)

(56) References Cited

U.S. PATENT DOCUMENTS 4,217,165 A * 8/1980 Frosch .................... C30B 15/00 117/922
4,318,769 A * 3/1982 Sachs ...................... C30B 15/26 117/14
(Continued)

FOREIGN PATENT DOCUMENTS

WO 2015148181 10/2015

OTHER PUBLICATIONS

WIPO, International Search Report and Written Opinion for PCT/US2021/018790, Jun. 22, 2021.
(Continued)

*Primary Examiner* — Kenneth A Bratland, Jr.
(74) *Attorney, Agent, or Firm* — Summit Patents PC

(57) ABSTRACT

An optical sensor is configured to detect a difference in emissivity between the melt and a solid ribbon on the melt, which may be silicon. The optical sensor is positioned on a same side of a crucible as a cold initializer. A difference in emissivity between the melt and the ribbon on the melt is detected using an optical sensor. This difference in emissivity can be used to determine and control a width of the ribbon.

13 Claims, 3 Drawing Sheets

(51) Int. Cl.
*C30B 15/10* (2006.01)
*C30B 29/06* (2006.01)

(58) Field of Classification Search
CPC ......... C30B 15/26; C30B 29/00; C30B 29/02; C30B 29/06; C30B 35/00; C30B 35/002
USPC ...... 117/11, 13–16, 23, 26–27, 30, 200–202, 117/206, 208, 209, 211–212, 217, 928, 117/931–932
See application file for complete search history.

(56) References Cited

U.S. PATENT DOCUMENTS

| | | | | |
|---|---|---|---|---|
| 4,329,195 | A | 5/1982 | Kudo | |
| 6,110,274 | A | 8/2000 | Okuno | |
| 6,187,090 | B1 | 2/2001 | Maeda et al. | |
| 7,816,153 | B2 | 10/2010 | Kellerman et al. | |
| 7,855,087 | B2 | 12/2010 | Kellerman et al. | |
| 8,064,071 | B2 | 11/2011 | Rowland et al. | |
| 8,475,591 | B2 | 7/2013 | Kellerman et al. | |
| 9,057,146 | B2 | 6/2015 | Rosen et al. | |
| 9,112,064 | B2 | 8/2015 | Kellerman et al. | |
| 9,587,324 | B2 | 3/2017 | Carlson et al. | |
| 10,415,151 | B1 | 9/2019 | Kellerman et al. | |
| 10,801,125 | B2 | 10/2020 | Kellerman et al. | |
| 2009/0232359 | A1* | 9/2009 | Urano | C30B 15/305 382/106 |
| 2009/0302281 | A1* | 12/2009 | Kellerman | C30B 28/06 252/519.1 |
| 2011/0271897 | A1 | 11/2011 | Kellerman et al. | |
| 2011/0271899 | A1 | 11/2011 | Kellerman | |
| 2011/0280784 | A1 | 11/2011 | Ydstie et al. | |
| 2012/0211917 | A1 | 8/2012 | Glabbeek | |
| 2013/0213295 | A1 | 8/2013 | Mackintosh | |
| 2016/0108549 | A1* | 4/2016 | Kellerman | C30B 15/002 117/212 |
| 2018/0047864 | A1* | 2/2018 | Kellerman | C30B 15/14 |

OTHER PUBLICATIONS

WIPO, International Search Report and Written Opinion for PCT/US2021/018773, Jun. 11, 2021.

* cited by examiner

ACTIVE EDGE CONTROL OF A CRYSTALLINE SHEET FORMED ON THE SURFACE OF A MELT

CROSS-REFERENCE TO RELATED APPLICATIONS

This application claims priority to the provisional patent application filed Feb. 19, 2020 and assigned U.S. App. No. 62/978,484, the disclosure of which is hereby incorporated by reference.

STATEMENT REGARDING FEDERALLY-SPONSORED RESEARCH OR DEVELOPMENT

This invention was made with government support under Award Number DEEE0008132 awarded by the U.S. Department of Energy. The government has certain rights in the invention.

FIELD OF THE DISCLOSURE

This disclosure relates to formation of crystalline sheets from a melt.

BACKGROUND OF THE DISCLOSURE

Silicon wafers or sheets may be used in, for example, the integrated circuit or solar cell industry. Previously, cut silicon wafers were made by wire-sawing large silicon ingots or boules made from the Float-Zone process, Czochralski (Cz) process, modified Czochralski process where magnetic fields are used to control oxygen, or a directionally solidified ("cast") process.

A single-step, continuous process that directly produces single crystal wafers from polysilicon feedstock is highly desirable. Continuous, direct wafer processes that produce net-shaped wafers eliminate many costly downstream process steps (like wire sawing) and can produce wafers with more uniform properties than discrete Cz ingot production. Unfortunately, historic direct silicon wafer processes have not been able to create the full-size single crystal silicon wafers. Specifically, vertical ribbon processes like Edge-Fed Growth and String Ribbon as well as horizontal substrate processes like Ribbon Growth on Substrate or Direct Wafer produce multicrystalline wafers. One vertical ribbon process known as Dendritic Web showed ability to make single crystal wafers, however the process could only yield narrow material (e.g., approximately 2 inches wide) before going unstable. Solar and semiconductor devices require larger wafers (>4 inches) for economic device manufacturing. Directly making single-crystal silicon wafers by epitaxially growing full-size silicon wafers on a porous silicon substrate that is then mechanically separated from the porous substrate also has been performed. Producing a wafer from epitaxial growth is expensive and subject to minority carrier lifetime (MCL)-limiting defects like stacking faults and dislocation cascades.

One promising method that has been investigated to lower the cost of materials for solar cells is the floating silicon method (FSM), which is a type of horizontal ribbon growth (HRG) technique where crystalline sheets are pulled horizontally along the surface of a melt. In this method, a portion of a melt surface is cooled sufficiently to locally initiate crystallization with the aid of a seed, which may be then drawn along the melt surface (while floating) to form a monocrystalline sheet. The local cooling may be accomplished by employing a device that rapidly removes heat above the region of the melt surface where crystallization is initiated. Under proper conditions, a stable leading edge of the crystalline sheet may be established in this region. Formation of a faceted leading edge is not obtained in Cz or other ribbon growth processes, and can add inherent stability to the growth interface.

In order to sustain the growth of this faceted leading edge in a steady-state condition with the growth speed matching of the pull speed of the monocrystalline sheet or "ribbon," intense cooling may be applied by a crystallizer in the crystallization region. This may result in the formation of a monocrystalline sheet whose initial thickness is commensurate with the width of the applied intensive cooling profile. The initial thickness is often on the order of 1-2 mm in the case of silicon ribbon growth. For applications such as forming solar cells from a monocrystalline sheet or ribbon, a target thickness may be on the order of 200 μm or less. This may necessitate a reduction in thickness of the initially formed ribbon. This may be accomplished by heating the ribbon over a region of a crucible containing the melt as the ribbon is pulled in a pulling direction. As the ribbon is drawn through the region while the ribbon is in contact with the melt, a given thickness of the ribbon may melt back, thus reducing the ribbon thickness to a target thickness. This melt-back approach is particularly well suited in FSM, wherein a silicon sheet is formed floating on the surface of a silicon melt according to the procedures generally described above.

One challenge involved in thinning the ribbon is thinning near the ribbon edge. The "thinning heat" provided near the edge of the ribbon can diffuse laterally to the melt at the side edge of the ribbon (not just the bottom), which causes the ribbon to narrow. As the ribbon narrows, more of the thinning heat result is available at the edge, resulting in further super-heating and further narrowing, thereby causing positive feedback (i.e., an instability), which may result in severe, uncontrolled narrowing of the ribbon.

Improved techniques to form ribbons or wafers are needed.

BRIEF SUMMARY OF THE DISCLOSURE

An apparatus for controlling a thickness of a crystalline ribbon grown on a surface of a melt is provided in a first embodiment. The apparatus includes a crucible configured to hold a melt, a cold initializer facing an exposed surface of the melt, a segmented thinning controller, and optical sensors configured to detect a difference in emissivity between the melt and a solid ribbon on the melt. The segmented thinning controller is configured to adjust a width and thickness of a ribbon formed on the melt. The optical sensors are positioned above the crucible on a same side of the crucible as the cold initializer such that the optical sensors are positioned on an opposite side of the segmented thinning controller from the cold initializer.

The segmented thinning controller can include a segmented cooling unit and uniform melt back heater or a segmented melt-back heater.

The apparatus can further include a processor in electronic communication with the optical sensors and the segmented thinning controller. The processor can be configured to adjust the segmented thinning controller based on a width of the ribbon detected with the optical sensors. The processor also can be configured to adjust one or both outermost segments of the segmented thinning controller. The adjusting can include changing a gas flow rate or a heater temperature.

A method is provided in a second embodiment. The method includes providing a melt in a crucible. The melt may include silicon. A ribbon is formed on a surface of the melt using a cold initializer facing an exposed surface of the melt. The ribbon is single crystal. The ribbon is pulled at a rate of ribbon formation. Heat is applied to the ribbon through the melt using a heater disposed below the melt. The ribbon is thinned with a segmented thinning controller. A difference in emissivity between the melt and the ribbon on the melt is detected using at least one optical sensor. The ribbon is separated from the melt at a wall of the crucible where a stable meniscus forms.

The method can further include determining a width of the solid ribbon using the optical sensor.

The method can further include controlling the width using the segmented thinning controller. The controlling can include adjusting the segmented thinning controller based on the width of the crystalline ribbon. The adjusting can include changing a temperature of cold blocks in the segmented thinning controller and/or changing a gas flow rate of gas jets emitted from the segmented thinning controller.

The segmented thinning controller can include a segmented cooling unit and uniform melt back heater or a segmented melt-back heater.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Active edge control can be performed in an FSM process. The edge of the wafer can be optically detected using the difference in emissivity between the solid and liquid. The solid ribbon has a higher emissivity than the liquid surrounding it, making it appear brighter. This effect can be enhanced by using the high reflectivity of the liquid. If the viewport to the topside of the melt is positioned perpendicular to the melt surface, the cold hole that the viewport makes through the insulation will reflect back off of the melt as a dark spot. The melt is also typically oscillating with some level of wave perturbations, while the solid ribbon experiences little vibration. Using a combination of these effects, a camera or other type of optical sensor can determine the position of the ribbon edge. This wafer edge detection can be used to control a cooling and/or heating unit, such as an edge control cooling element in a cooled thinning controller (CTC) or a melt-back heater. Thus, in an embodiment, a cooling from above and/or heating from below can be used to accomplish uniform thinning of a ribbon. Active edge detection can be used to provide negative feedback using the edge thickness control elements in order to stabilize the ribbon width.

Figure 1:
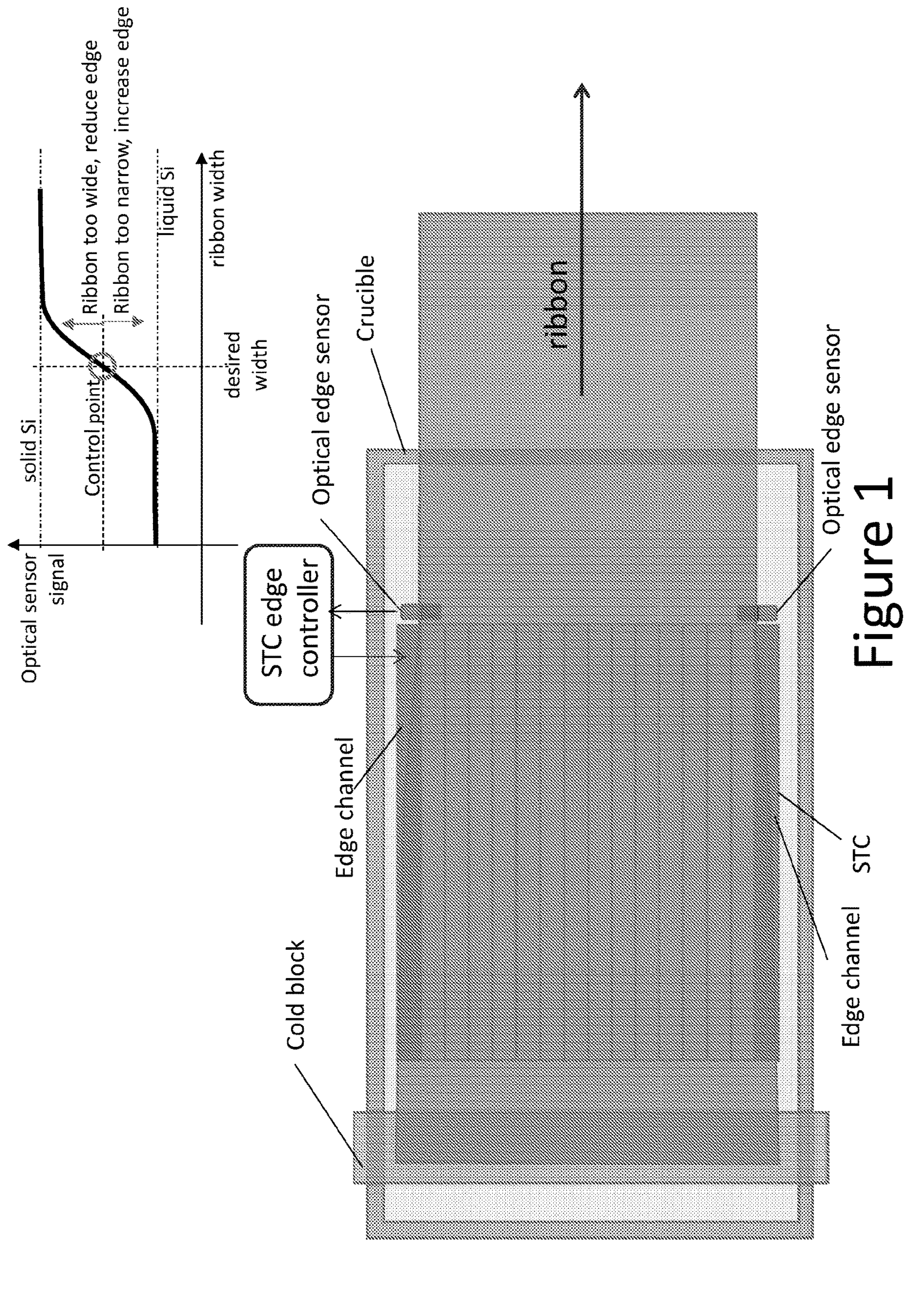
FIG. 1 illustrates active edge control in an exemplary system.

While it can be difficult to measure the thickness profile while the ribbon is still in the melt (to obtain real-time thickness control), the location of the edge of the ribbon can be determined. This is shown in FIG. 1. The optical edge sensor can use the difference in emissivity between silicon solid and liquid and/or vibration differences between the melt and ribbon to detect the edge of the ribbon. These differences in emissivity and/or vibration can be shown in an image. Embodiments can use pyrometers focused at the edge, a CCD camera using edge detection software, a line scan sensor, a brightness detector, or other devices. The image can be generated through an opening in the chamber and/or insulation around the system, such as a viewport.

This edge location signal can be fed back to the edge segment of the thickness controller and provides the negative feedback to stabilize the ribbon's edge and ribbon width. As shown in FIG. 1, a low edge pyrometer signal can indicate a narrow ribbon. The edge thickness control element can be adjusted to reduce narrowing of the ribbon (e.g., by lowering an edge heating element or raising an edge cooling element), thus providing negative feedback stabilization.

In an embodiment, the system and method can use a device that provides a modulated profile of cooling on the surface of the ribbon, referred to as a cooled thinning controller (CTC) with a uniform melt-back heater (UMBH). Two varieties of CTCs are possible, either a plurality of cooling jets in a gas-cooled thinning controller (GCTC) or a radiation-cooled thinning controller (RCTC). For simplicity, the GCTC is used in an example. A plurality of jets can be used together to provide a uniform and thin "knife" jet of controllable width and profile (as disclosed in U.S. Pat. No. 9,957,636, which is incorporated by reference in its entirety), but also can be controlled to an arbitrary cooling profile to achieve, for example, a wide and uniformly-thick ribbon. Thus, during operation, the various jets can be controlled to provide a desired net ribbon thickness profile. This arbitrary shape can have a particular minimum feature size or resolution. Narrowing of the ribbon can be controlled by increasing cooling in areas where narrowing is occurring. GCTC is capable of achieving better resolution than the segmented melt-back heater (SMBH) approach in a flat bottom crucible, especially with depth>1 cm, although control of the ribbon narrowing may be possible using the edge segments of the SMBH. For example, see the SMBH system disclosed in U.S. Pat. No. 10,030,317, which is incorporated by reference in its entirety.

Active edge control can be performed by directly detecting ribbon edges using an optical sensor with a light pipe and camera system downstream of the segmented thinning controller (STC) with respect to a direction of a ribbon movement. The STC may be a combination of a SMBH or UMBH with a CTC. The STC can be controlled using information from the edge optical sensor. The optical sensor provides signal correlated with the edge location. The optical sensor can use a difference in emissivity between solid silicon (approximately 0.6) and liquid silicon (approximately 0.2) and/or differences in vibration between the solid ribbon and melt. Edge elements of the STC can be modulated to provide negative feedback for stable edge control.

In an instance, the GCTC has from 4-32 jets across a width of a ribbon, which can be selected to adjust the ribbon thickness profile. For example, 16 jets can be used for a 16 cm width ribbon (i.e., 1 cm per jet). A gas flow from each gas jet of argon, nitrogen, helium, and/or hydrogen can be on the order of 0.1 to 3 standard liters per minute (SLM) per channel. Each gas jet can be a separate channel or multiple gas jets can be combined in a single channel. A gas temperature at the exit of the gas jet can be in a range from 300-600K. The gas jets can be positioned from 2-10 mm from a surface of the melt or the ribbon. The exit of the gas jet may be protected from SiO deposition by a purge gas.

In an instance, the RCTC can include from 4-32 heaters across a width of the ribbon, such as 16 heaters for a 16 cm width ribbon (i.e., 1 heater/cm). The heaters may be positioned from 3-10 mm above the melt or ribbon. The heaters can be raised or lowered in a vertical direction relative to a surface of the melt or ribbon using an actuator. Heater power can be regulated in feedback, such as 50-300 W/channel. Each heater may be a separate channel or multiple heaters can be combined in a single channel. To maximize the spatial resolution of the RCTC, heat shields can be positioned between each heater channel, cutting down on the view factor of the ribbon surface and also reducing thermal mixing between adjacent heaters.

In an instance, the UMBH can have a single heater controlled with a single power control circuit. The UMBH can be configured to provide uniform melt-back heat into the melt. The UMBH may have approximately the same area opposite the crucible as the GCTC or RCTC. The UMBH may not allow segmentation at the outermost edges like the RCTC, GCTC, or SMBH, but can be uniformly controlled across the UMBH using information from the optical sensors.

While disclosed as adjusting width, the STC also can adjust the thickness of the ribbon. A higher melt temperature or temperature above the ribbon can be used to thin the ribbon.

Two optical sensors are illustrated in FIG. 1. This allows the edge of the ribbon to be measured and controlled on opposite sides of its width. One optical sensor or more than two optical sensors also can be used. For example, pairs of optical sensors can be positioned at various locations along the length of the ribbon.

The STC also can include a processor that receives the measurements or data from the edge optical sensor. In some embodiments, various steps, functions, and/or operations of system and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random-access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor (or computer system) or, alternatively, multiple processors (or multiple computer systems). Moreover, different sub-systems of the system may include one or more computing or logic systems. Therefore, the above description should not be interpreted as a limitation on the present disclosure but merely an illustration.

The method or algorithm for controlling the thickness of the ribbon ("melt-back thinning algorithm" or MBTA) can use a ribbon thickness profile to determine the required melt-back thinning profile $\Delta t(x)$ to get to the target (desired) uniform shape. The desired heat profile Qdes(x) needed to achieve the desired thinning profile is calculated. The combination of heat fluxes (modeled) Qnet(x) that comes closest to Qdes(x) is determined. The sum of thickness controlling profiles can include the UMBH or SMBH with the GCTC or RCTC. The sum of thickness controlling profiles also can include the UMBH or SMBH. The sum of thickness controlling profiles also can include the GCTC or RCTC. The STC can control the UMBH or SMBH with the GCTC or RCTC, the UMBH or SMBH, or the GCTC or RCTC.

Feedback of the ribbon thickness profile (using an algorithm such as the MBTA) can be accomplished by measuring the ribbon profile (e.g., optically) after it leaves the furnace (at room temperature), downstream and, therefore, with a long latency. This latency can result in severe narrowing, which causes loss of data (no ribbon to measure near edge) and can make melt-back control difficult. If the thickness profile can be measured (i.e., after the ribbon leaves the furnace), the required melt-back heat/cool profiles can be calculated to produce the desired thickness profile (MBTA). However, this will not work if narrowing results in the loss of ribbon. Thus, real-time measurement of the ribbon width may be needed instead.

In an instance, a decrease in measured brightness can mean the ribbon width is shrinking. If the ribbon width is shrinking, instructions can be sent to make the outermost edge channel or channels of the STC colder. There may be a limit to the desired edge width of the ribbon, so a brightness increase can mean the ribbon width is increasing or too wide. If the ribbon width is increasing or too wide, instructions can be sent to make the outermost edge channel or channels of the STC warmer. To make the edge wider or narrower, the temperature of cold blocks or gas flow rate of the gas jets in the STC can be adjusted. The changes in temperature in the STC can be adjusted to avoid overshooting the desired ribbon width. In an instance, the ribbon width can be corrected from an out-of-control state using the embodiments disclosed herein within 10-20 cm of ribbon length.

A ribbon width can be determined based on the two optical edge sensors and the distance between them across a width of the crucible. For example, the ribbon width can be the width in the images of the two optical sensors plus a distance of an offset between the two optical sensors. The optical edge sensors can be positioned downstream (relative to movement of the ribbon) from one or more outermost channels of the STC. One or more edge channels of the STC can be adjusted based on information from the optical edge sensor.

The segmented cooled thinning controller and uniform melt-back heater can be used in an FSM system for ribbon production. A system for FSM ribbon production, such as that illustrated in FIG. 2, can include a cold initializer having a cold initializer surface that directly faces an exposed surface of the melt. The cold initializer is configured to form a ribbon floating on the surface of the melt at the same rate it is pulled. During operation a melt is provided in the crucible. The thickness of the ribbon is controlled in a melt-back zone before the ribbon separates from the melt at the crucible wall where a stable meniscus forms.

Figure 2:
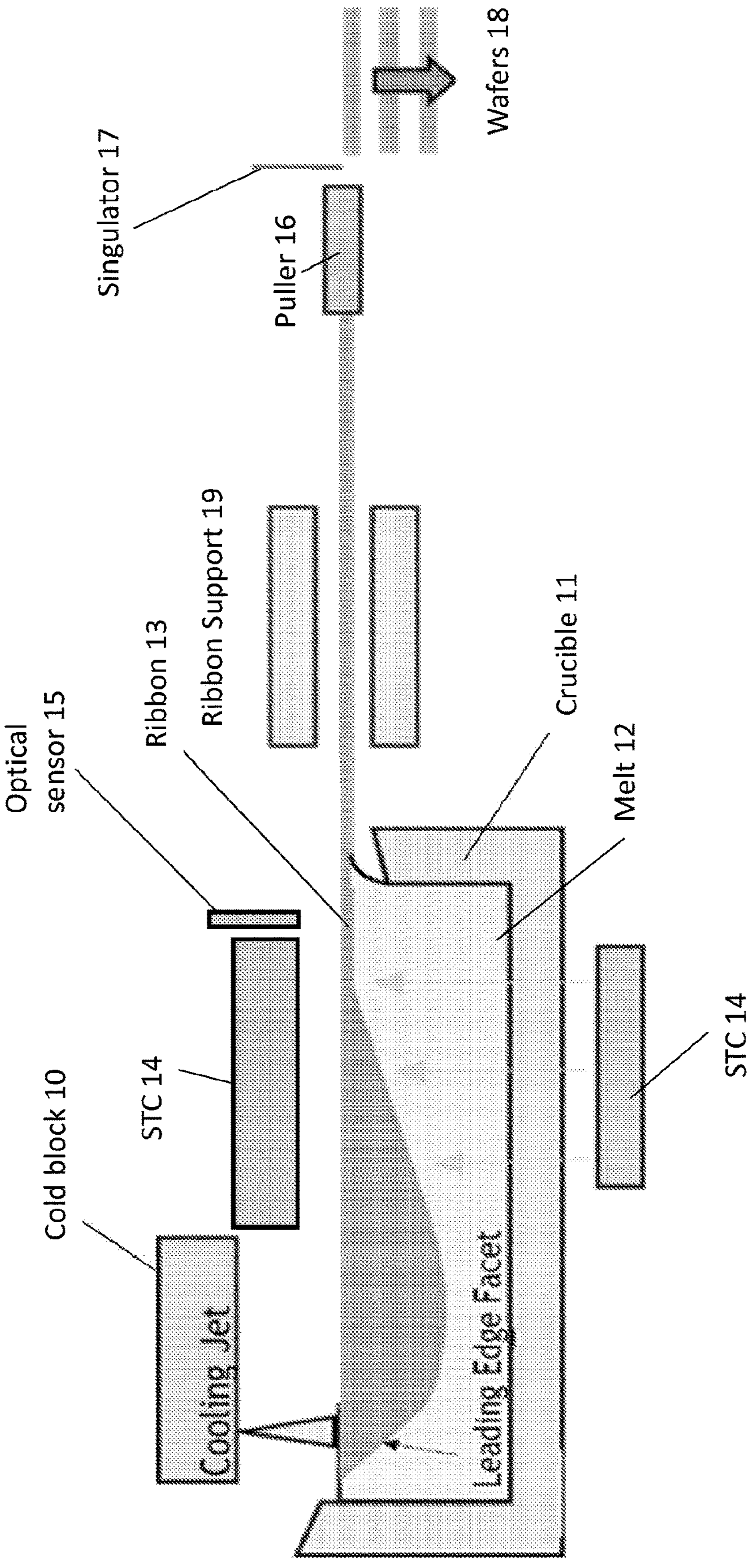
FIG. 2 illustrates a system that uses active edge control in accordance with the present disclosure.

A system for wafer production, such as that illustrated in FIG. 2, can include a crucible 11 for housing a melt 12 and a cold block 10 having a cold block surface that directly faces an exposed surface of the melt 12. The cold block 10 is an example of a cold initializer. The cold block 10 is configured to generate a cold block temperature at the cold block surface that is lower than a melt temperature of the melt 12 at the exposed surface whereby a ribbon 13 is formed on the melt 12. The cold block 10 also can provide a cooling jet to assist in formation or initialization of the solid ribbon. During operation a melt 12 is provided in the crucible 11. A ribbon 13 is formed horizontally on the melt 12 using the cold block 10 with a cold block surface that directly faces an exposed surface of the melt 12. An STC 14 can adjust the thickness of the ribbon 13 in the melt 12 after it is formed using images or other data from the optical sensor 15. While only one optical sensor 15 is illustrated in FIG. 2, more than one optical sensor 15 can be used. The ribbon 13 is pulled from the melt 12 at a low angle off the melt surface using the puller 16, which may be a mechanical ribbon pulling system. The ribbon 13 may be pulled from the crucible 11 at a 0° angle or at a small angle relative to a surface of the melt 12 (e.g., less than 10°). The ribbon 13 is supported and singulated into wafers, such as using a singulator 17. The wafers 18 made using this system can have the thickness described herein.

The embodiments disclosed herein can control the ambient environment around the ribbon at high temperatures (e.g., 1200 to 1414° C. or 1200 to 1400° C.). Relevant atmospheric pressures include low sub-atmospheric pressures (e.g., 0.01 atm) to positive-pressure systems (e.g., 5 atm). Further, the gas flow profiles around the ribbon surfaces can minimize metallic contamination via gas transport.

There can be one or more gas zones with different gas mixtures around the ribbon 13. These gas zones can target one or more sides of the ribbon 13. In an instance, the gas zones can be configured to minimize metallic contamination to the ribbon surface. The gas zones can be separated by structural barriers or gas barriers, which can isolate each gas zone.

The solid ribbon 13 can separate over the edge of the crucible 11 at a slightly raised height of approximately 0.2 mm to 2 mm, which can ensure that a stable meniscus is maintained and that the melt 12 does not spill over the lip of the crucible 11 during separation. The crucible 11 edge can also be shaped to include pinning features to increase meniscus or capillary stability. The gas pressure on the meniscus between the ribbon surface and the crucible 11 can be increased to increase meniscus stability. One example on how to increase gas pressure is to locally focus an impinging jet directly at this meniscus formed between the crucible edge and the ribbon surface.

As the ribbon 13 travels from the cold initializer to where it reaches room temperature, the ribbon 13 is mechanically supported to minimize metallic contamination and the generation of defects, such as with ribbon support 19. Mechanically deflecting a thin ribbon 13 at high temperature can mechanically yield (i.e. plastically deform) the ribbon 13 and give rise to undesirable crystal defects such as dislocations. Physical contact with the ribbon 13 can locally result in undesirable slip, dislocations, and metallic contamination. As the ribbon 13 floats on the melt surface, a mechanism to support the ribbon 13 over the melt is optional. The ribbon 13 can be supported as it separates over the edge of the crucible 11 because that is where it is expected to experience the most mechanical deflection. The ribbon 13 can be supported during the pulling after the ribbon 13 is separated from the melt via several approaches, including gas flow levitation and/or a mechanical support. First, the ribbon 13 can be levitated by directed gas flows that create local high or low pressures on the ribbon surface to support the ribbon 13. Examples of gas flow levitation approaches can include Bernoulli grippers, gas bearings, air-hockey tables, or other techniques that use gas pressure. Another approach is to mechanically support the ribbon 13 with, for example, rollers or sliding rails. To minimize deleterious effects with this contact approach, the contact pressure between these supports and the ribbon surface may be minimized. The supports may be made of high temperature semiconductor-grade materials that do not readily contaminate silicon like silicon carbide, silicon nitride, quartz, or silicon. Deflection of the ribbon 13 may be minimized to prevent the ribbon 13 from mechanically yielding, warping, or producing structural defects.

The system may include one or more temperature zones, which may be from 2 cm to 500 cm in length. More than two temperature zones are possible. Each of the zones can be separated or isolated. Gas curtains between the zones can provide isolation. Gas flows using particular pressures, gas flows combined with vacuum settings or vacuum pumps, baffles or other geometric structures, and/or the ribbon 13 itself also can be used to isolate the zones from each other. In an instance, the zones can be separated by insulation, heat shields, heaters, or other physical mechanisms.

For example, the temperature zones can be from 800° C. to approximately 1414° C. using either an inert or reducing atmosphere. The dwell time can be from 1 minute to 60 minutes per temperature zone. In an instance, the temperature in one zone can span the range from 1200° C. to approximately 1414° C. Additional gases, such as dopants, can be included at similar temperatures.

In an instance, there may be sections where temperature is maintained at a temperature setpoint for a particular time to control defect profiles. A temperature gradient across the ribbon 13 can be implemented to minimize the effects of thermal stress. The temperature gradient along the pull direction can be implemented to minimize the effects of thermal stress. The second derivative of the temperature profile can be controlled to minimize thermal stress and mechanical warpage. The system can include one or more temperature gradients and/or second derivatives. The temperature zones can be created and maintained by a combination of resistive heaters, profiled insulation, radiative geometries and/or surfaces, and gas flows.

In combination with the tailored thermal profile, the gas atmosphere and mechanical support of the ribbon 13 can be tailored to also increase material performance as the ribbon 13 transitions from high temperature to room temperature. The ribbon 13 can be exposed to different gas mixtures to either create functionality or increase performance. Exposing the ribbon 13 to an inert gas like argon or nitrogen can maintain its cleanliness, and creating a mixture of argon with a reducing gas like hydrogen can further assist the surface cleanliness. In addition, it has been shown that mixtures of argon, nitrogen, and oxygen can increase the precipitation of oxides if that is desired. Using a gas mixture containing oxygen and some water vapor can grow a thermal oxide on the wafer surface that minimizes metallic contamination. Another gas mixture can contain phosphorous oxychloride or a chloride gas. Exposing the ribbon to phosphorous oxychloride or chloride gas would have the combined effect of locally creating a wafer surface with a high phosphorous concentration and a protective glass surface. This highly doped surface would getter metallic contamination, and therefore increase bulk MCL which would be desirable for devices like solar cells. The glass surface would prevent further metallic contamination from the environment to the wafer. While the ribbon 13 travels from the crucible to room temperature, there can be one or many gas mixtures exposed to the ribbon. These gas mixtures can be separated by gas curtains, guiding flow geometries, and other techniques intended to separate gas mixtures from each other. Atmospheric pressures in one or all of these gas zones can include low sub-atmospheric pressures (e.g., 0.01 atm) to positive-pressure systems (e.g., 5 atm). The system atmosphere can be open to the ambient environment or sealed. The gas flow profiles around the ribbon surfaces can be tailored to increase outgassing while also minimizing metallic contamination via gas transport.

After the ribbon 13 is cooled to approximately room temperature, the ribbon 13 can be singulated into discrete wafers 18. The wafers 18 can be rectangular, square, pseudo square, circular, or any geometry that can be cut from a ribbon. Singulation can be performed by traditional techniques like laser scribing and cleaving, laser ablation, and mechanical scribing and cleaving. The final discrete wafer lateral dimensions can range from 1 cm to 50 cm (e.g., 1-45 cm or 20-50 cm), with thickness from 50 microns to 5 mm and either a uniform thickness (low total thickness variation), or even a tailored thickness gradient, if that were desirable.

The wafers 18 can then be further processed or marked to generate additional features or material properties for the final semiconductor devices or solar cells. In an example, the wafers 18 can be ground, polished, thinned or textured with chemicals or mechanical abrasion. In another example, the wafers 18 can be either chemically textured or mechanically polished to create the desired final surface roughness. Material or geometry features can be added to the surface or in the bulk create the final desired devices. Example final products can include but are not limited to solar cells, MOSFETs, or anodes for lithium-ion batteries.

Figure 3:
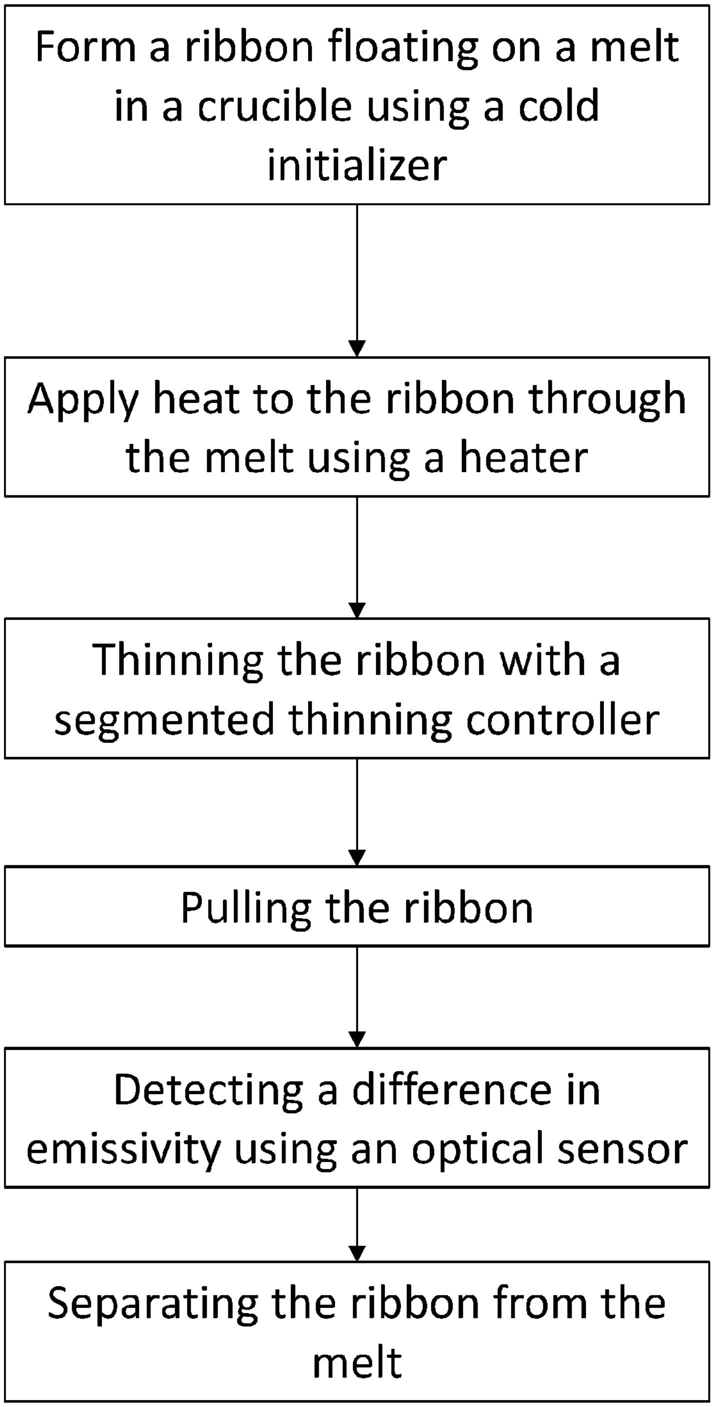
FIG. 3 is a flowchart of a method in accordance with the present disclosure.

FIG. 3 is a flowchart of an exemplary embodiment. A melt is provided in a crucible, which may include silicon. A ribbon is formed floating on the melt using a cold initializer facing an exposed surface of the melt. The ribbon is single crystal. The ribbon is pulled at a rate of crystalline ribbon formation, which may be a same rate as the pulling. Heat is applied to the ribbon through the melt using a heater disposed below the melt. Diffusion of heat into an edge of the ribbon can be minimized using two quartz diffusion barriers disposed in the melt. The ribbon is thinned with a segmented thinning controller. A difference in emissivity between the melt and the ribbon is detected using an optical sensor. The ribbon is separated from a wall of a crucible where a stable meniscus forms.

A width of the solid ribbon can be determined using the optical sensor. The width can be controlled using the segmented thinning controller. This can include adjusting the STC based on the width of the crystalline ribbon.

The segmented thinning controller can include a segmented cooling unit and uniform melt back heater. The segmented thinning controller also can include a segmented melt-back heater.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An apparatus for controlling a thickness of a crystalline ribbon grown on a surface of a melt, the apparatus comprising:

a crucible configured to hold the melt;

a cold initializer configured to produce a cooling jet that is directed toward the surface of the melt;

an optical imaging device comprising a camera or a CCD camera configured to, in part, produce an image of at least a portion of the melt and the crystalline ribbon;

a processor comprising electronic circuits, logic gates, multiplexers, programmable logic devices, ASICs, analog or digital controls/switches, microcontrollers, or computing systems, the processor configured to determine, based at least in part on the image, a location of an edge of the crystalline ribbon relative to the melt surface using differences in emissivity and vibration, and to adjust a width and a thickness of the crystalline ribbon on the melt by varying a gas flow or heat of one or more of a plurality of segments based on the determined edge location; and a segmented thinning controller that includes the plurality of segments that are each configured to output the gas flow or heat, wherein the segmented thinning controller is configured to adjust the width and the thickness of the crystalline ribbon on the melt based on signals received from the processor.

2. The apparatus of claim 1, wherein the segmented thinning controller is below the crucible and includes a uniform melt back heater that includes a heater that is configured to be controlled by the processor based on the image.

3. The apparatus of claim 1, wherein the processor is in electronic communication with the optical imaging device and the segmented thinning controller, and wherein the processor is configured to control the segmented thinning controller based on a detected width of the crystalline ribbon in the image.

4. The apparatus of claim 3, wherein the processor is configured to adjust the gas flow or heat output from at least one outermost segment among the plurality of segments of the segmented thinning controller.

5. A method comprising:

providing a melt in a crucible;

forming a ribbon on a surface of the melt using a cold initializer configured to produce a cooling jet that is directed toward the surface of the melt, wherein the ribbon is a single crystal;

pulling the ribbon at a rate of ribbon formation;

applying heat to the ribbon through the melt using a heater disposed below the melt;

thinning the ribbon with a segmented thinning controller that includes a plurality of segments that are each configured to output a gas flow or the heat;

using at least one optical imaging device comprising a camera or a CCD camera to capture an image of at least a portion of the melt and the ribbon;

based at least in part on the image, determining a location of an edge of the ribbon relative to the melt surface using differences in emissivity and vibration between the melt and the ribbon;

controlling a width of the ribbon by varying the gas flow or the heat output of one or more of the plurality of segments of the segmented thinning controller based on the determined edge location; and separating the ribbon from the melt at a wall of the crucible where a stable meniscus forms.

6. The method of claim 5, further comprising determining a width of the ribbon based on the image.

7. The method of claim 5, wherein the melt includes silicon.

8. The method of claim 5, wherein the segmented thinning controller is below the crucible and includes a uniform melt back heater that is configured to be controlled based on the image.

9. The apparatus of claim 1, further comprising a viewport positioned over and perpendicular to the melt, wherein the optical imaging device is positioned to view the melt and the crystalline ribbon via the viewport.

10. The apparatus of claim 1, further comprising a pyrometer focused on an edge of the crystalline ribbon and configured to provide pyrometer signals to the segmented thinning controller.

11. The method of claim 5, further comprising providing a view for the optical imaging device of the melt and the ribbon via a viewport that is positioned over and perpendicular to the melt.

12. The method of claim 5, wherein determining the difference in the emissivity is further based, at least in part, on pyrometer signals generated by a pyrometer that is focused on an edge of the ribbon.

13. The method of claim 5, wherein the ribbon is a single crystal.

* * * * *